United States Patent [19]

Cosmo

[11] Patent Number: 4,494,807
[45] Date of Patent: Jan. 22, 1985

[54] LOW PROFILE CHIP CARRIER CONTACT

[75] Inventor: Nicola Cosmo, Harrisburg, Pa.

[73] Assignee: AMP Incorporated, Harrisburg, Pa.

[21] Appl. No.: 453,328

[22] Filed: Dec. 27, 1982

[51] Int. Cl.³ .............................................. H01R 9/09
[52] U.S. Cl. .................................................. 339/17 CF
[58] Field of Search ................ 339/17 CF, 174, 17 M, 339/176 M, 176 MP

[56] References Cited

U.S. PATENT DOCUMENTS 3,940,786  2/1976  Scheingold et al. .................. 357/74
4,052,118 10/1977  Scheingold et al. ........... 339/17 CF
4,268,102  5/1981  Grabbe ............................. 339/75 M Primary Examiner—Neil Abrams
Attorney, Agent, or Firm—Donald M. Boles

[57] ABSTRACT

A low profile chip carrier housing contact having a very short electrical contact path is taught. Briefly stated, the device includes a frame having contacts arranged on each of the sides of the frame. The contact members are uniquely shaped so as to exert optimum forces of contact mating values between a leadless integrated circuit chip carrier package and a printed circuit board.

19 Claims, 5 Drawing Figures

LOW PROFILE CHIP CARRIER CONTACT

BACKGOUND OF THE INVENTION

This invention relates, generally, to an electrical contact for a leadless integrated circuit package and more particularly to a contact providing high density, low profile and short electrical path between a leadless integrated circuit chip carrier or package and a printed circuit board.

While the use of chip carrier housings for use with leadless integrated circuit packages is old, technology is advancing to the point where more and more is being done on individual chips at higher densities and speeds. Consequently, interconnection devices and therefore contacts between a leadless integrated circuit chip carrier or package and a circuit board are being called upon to be placed into higher and higher densities while still maintaining acceptable contact forces. Such types of devices or contacts may be found in U.S. Pat. No. 4,268,102 "Low Impedance Electrical Connecting Means For Spaced-Apart Conductors" issued May 19, 1981 to Grabbe; U.S. Pat. No. 4,052,118 "Contact Carrying Spring Member" issued Oct. 4, 1977 to Scheingold et al; and U.S. Pat. No. 3,940,786 "Device For Connecting Leadless Integrated Circuit Package To A Printed Circuit Board" issued Feb. 24, 1976 to Scheingold et al. However, such types of contacts are problematic to the extent that when manufactured so as to be very thin for high density purposes they become expensive or electrically unacceptable or exhibit physical characteristics which are undesirable. These undesirable or unwanted characteristics may be distortion or twisting of the actual contact member, unacceptably long contact lengths which although providing short electrical contact paths are physically long and thereby produce undesirable inductive, capacitve or signal propagation problems.

It is desirable to have a device which utilizes very short circuit paths providing contact wiping action, automatic compensation to match coefficient of expansion and which allows for high density usage. Further, it is desirable to have a device which is relatively simple to manufacture and assemble and which is capable of being used as a replaceable contact in a chip carrier housing. Such a device is taught by the present invention.

Accordingly, the present invention teaches and as an object of the present invention, a device for connecting a leadless integrated circuit chip carrier or package to a circuit board, comprising a circuit board having electrical conductors contained thereon, a generally rectangular chip carrier housing disposed on the circuit board for receivably receiving a leadless integrated circuit chip carrier, the carrier housing means having on each side thereof a plurality of slots for receivably receiving contacts, and contacts disposed in the slots for providing electrical communication between a leadless integrated circuit chip carrier and electrical conductors contained on the circuit board, the contacts having a first portion resembling an S which has been placed on its side having a second portion resembling a superimposed beam portion on one of the outermost curves, the beam portion having a contact area at each of its ends for providing electrical communication between a leadless integrated circuit chip carrier and electrical conductors contained on the circuit board, a first bracket disposed on the carrier housing for retaining the contacts in the carrier housing, a leadless integrated circuit chip carrier disposed on the carrier housing, and a second bracket on top of the leadless integrated circuit chip carrier for maintaining the leadless integrated circuit chip carrier in electrical communication with the contacts.

BRIEF DESCRIPTION OF THE DRAWINGS

Reference is now made to the description of the preferred embodiments illustrated in the accompanying drawings in which.

DESCRIPTION OF THE PREFERRED EMBODIMENTS

Figure 1:
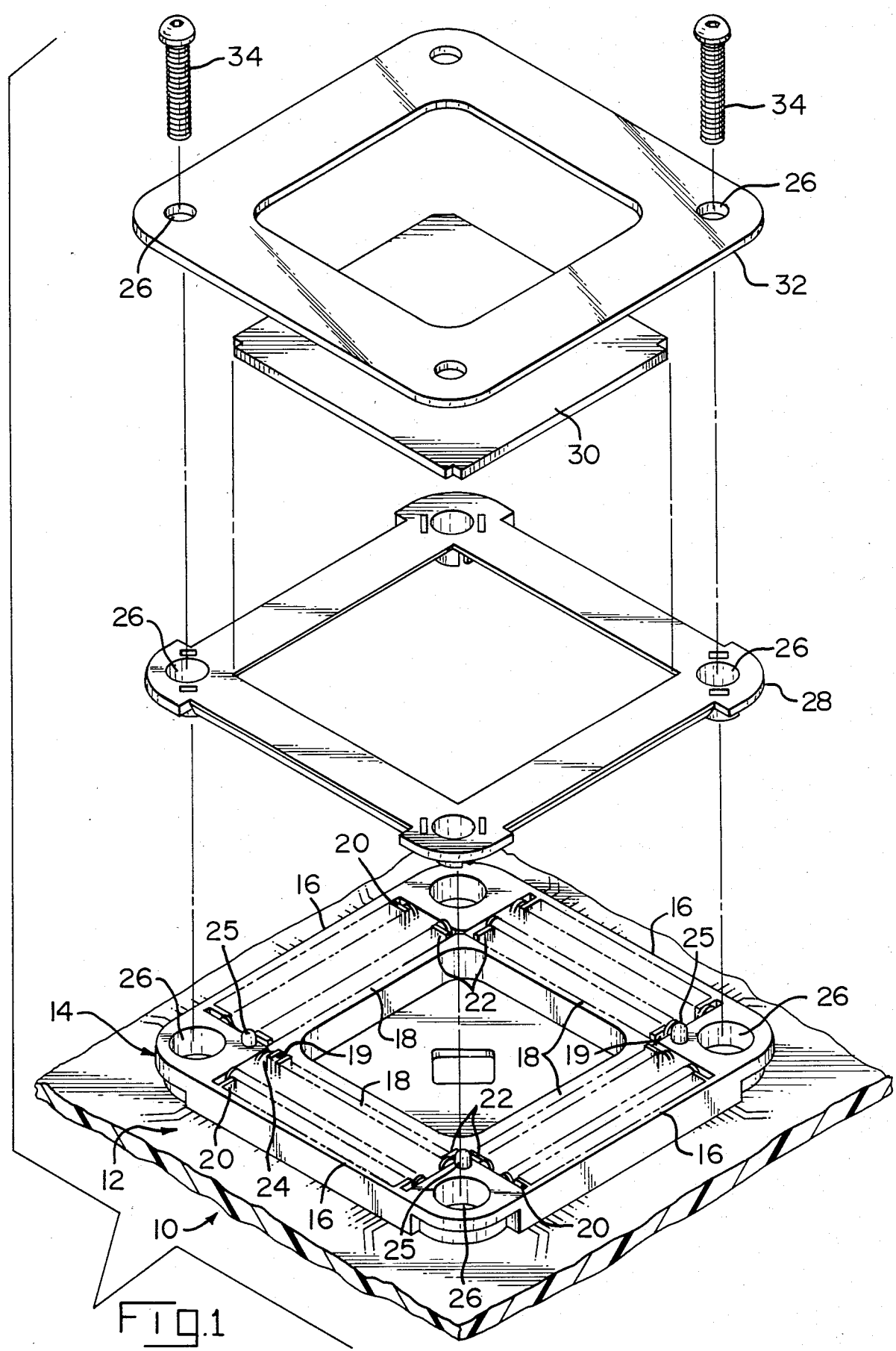
FIG. 1 is an exploded isometric view of a chip carrier housing with associated components utilizing the contacts of the present invention.

Referring now to FIG. 1 there is shown an isometric view of a chip carrier housing utilizing the present invention. A printed circuit board 10 having conductive strips 12 thereon has a chip carrier housing shown generally at 14 mounted thereon. The chip carrier housing 14 has exterior and interior walls 16, 18. Disposed between the exterior and interior walls 16, 18 are exterior wall contact barriers 20 and interior wall contact barriers 22 disposed on the exterior and interior of the chip carrier housing 14 respectively which thereby form slots or cavities 19 for retaining contacts 24. Contacts 24 are disposed between the contact barriers 20, 22 and are supported by the contact barriers 20, 22 and which also provide electrical isolation. Locating pins 25 are used to properly align the contact retainer 28 as well as the leadless integrated circuit chip carrier or package 30. The contact retainer 28 retains the contacts 24 in between the barriers 20, 22 and has disposed therein mounting holes 26. A leadless integrated circuit chip carrier 30 is then disposed in the interior of the center portion of the contact retainer 28 with a chip carrier retainer 32 then placed over the chip carrier 30. Mounting screws 34 are placed through the mounting holes 26 also contained in the chip carrier retainer 32 and the contact retainer 28 thereby securing the chip carrier 30 to the chip carrier housing 14 and thence the printed circuit board 10. The chip carrier housing 14 as well as the contact and chip carrier retainer 28, 32 in the preferred embodiment of the present invention are made of extruded plastic although it is to be understood that different materials can and may be used without departing from the spirit and scope of the present invention.

Figure 2:
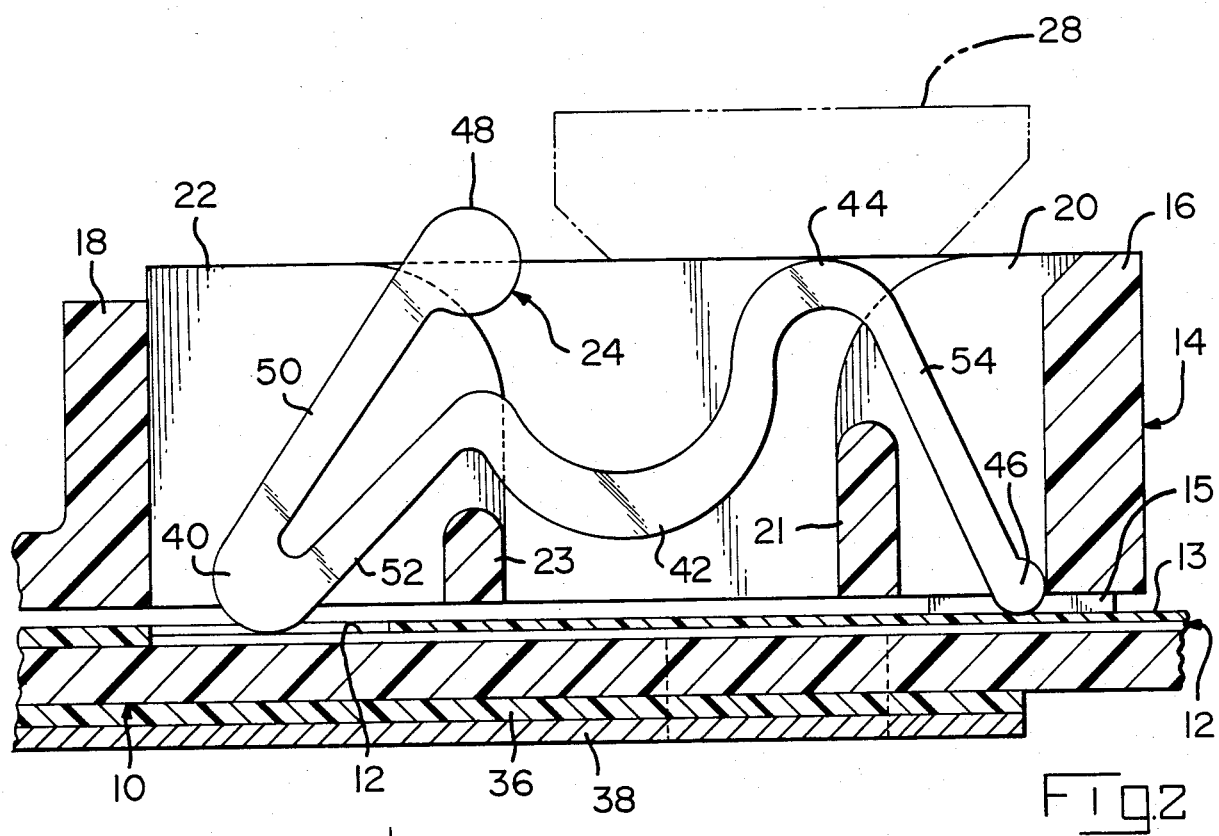
FIG. 2 is a cross-sectional view taken through a portion of FIG. 1 showing the contacts of the present invention before the insertion of an integrated circuit package.

Referring now to FIG. 2, there is a cross-sectional view taken through FIG. 1 showing a contact of the present invention prior to use of a leadless integrated circuit chip carrier. Here it can be seen how the chip carrier housing 14 rests on a spacing ledge 15 thereby maintaining the chip carrier housing 14 away from the surface of the printed circuit board 10 thereby allowing cleaning solvents, solders, or any of the materials to be washed away or removed from in-between the underside of the chip carrier housing 14. Shown also is a mask 13 which is disposed on the conductive strips 12 as well as most of the top portion of the printed circuit board 10 and which is used to protect the conductive strips 12 although it is to be understood that the mask 13 may be eliminated without departing from the spirit or scope of the present invention. Shown also is a spacer 36 and a lower mounting plate 38 which are used by the mounting screws 34 (not shown) to assemble the entire assembly as shown in FIG. 1 together. Shown also is the contact retainer 28 which holds the contact 24 in the proper position in the chip carrier housing 14. The exterior wall contact barrier 20 has an exterior wall contact barrier brace 21 which provides structural support between adjacent exterior wall contact barriers 20 as well as prohibiting the contact 24 from sliding down through the bottom portion of the chip carrier housing 14. On the interior wall contact barrier 22 is an interior wall contact barrier brace 23 which also provides structural support between adjacent interior wall contact barriers 22 as well as prohibiting displacement of the contact 24. Shown also is how the contact retainer 28 maintains the contact 24 in the chip carrier housing 14. The contact 24 is composed of a single or unitary member which in the preferred embodiment of the present invention is stamped out of a sheet of beryllium copper in the form shown. It is to be understood, however, that the contact 24 which resembles a U having an S portion attached thereto may be stamped in a straight configuration and bent into shape without departing from the spirit and scope of the present invention. Further, the contact 24 may be comprised of other materials such as glass or plastic with a conductive coating such as, for example, gold plated thereon. The contact 24 has an upper contact area 48 which is hemispherical in shape having an upper beam 50 at one end and at the other end a lower contact area 40 which is a semi-circular or bent configuration having a lower beam 52 attached thereto. The remaining end of the lower beam 52 is contiguous with a first bend 42 which then goes into a second bend 44 to an end beam 54 and thence to an end point 46. The bends of the contact 24 thusly provide optimum contact pressures and resiliency in an extremely small space.

Figure 3:
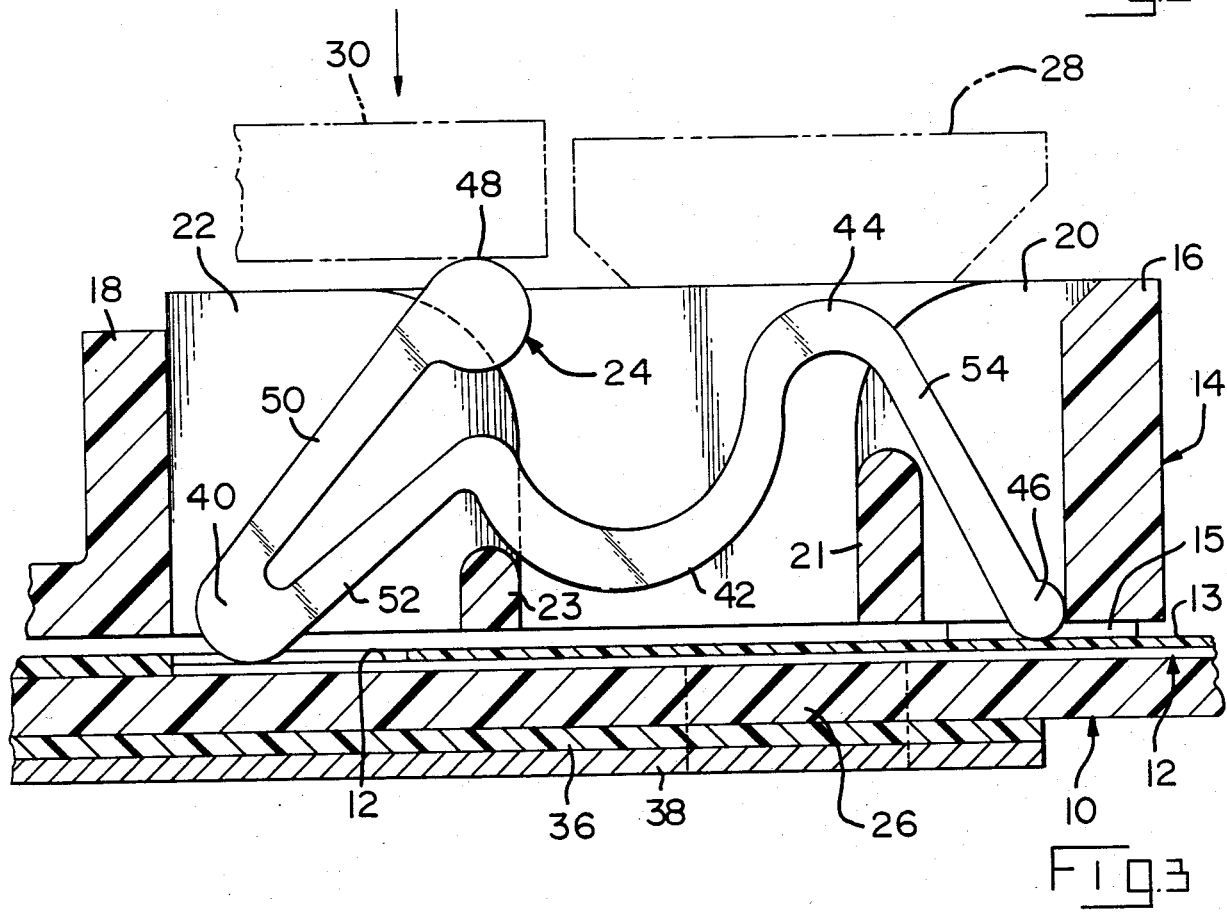
FIG. 3 is a cross-sectional view similar to that of FIG. 3 with a leadless integrated circuit package installed.

Referring now to FIG. 3 there is shown a view similar to that of FIG. 2 with a chip carrier 30 disposed thereon. Here it can be seen how the upper contact area 48 of the contact 24 electrically engages contact areas (not shown) on the underside of the chip carrier 30 while the lower contact area 40 electrically engages the conductive strip 12. Also evident is that during engagement of the chip carrier 30 the lower contact area 40 in a wiping motion moves across the conductive strip 12 with the upper contact area 48 performing a similar function with respect to the chip carrier 30. In this manner, a wiping movement is ensured which thereby cleans associated contact surfaces ensuring good electrical contact. Also evident is the circuit path between the upper and lower contact areas 48, 40 through the upper beam 50. This, therefore, provides an extremely short circuit path which thereby minimizes any inductive, capacitive, or propagation delay problems which are attendant thereto.

Figure 4:
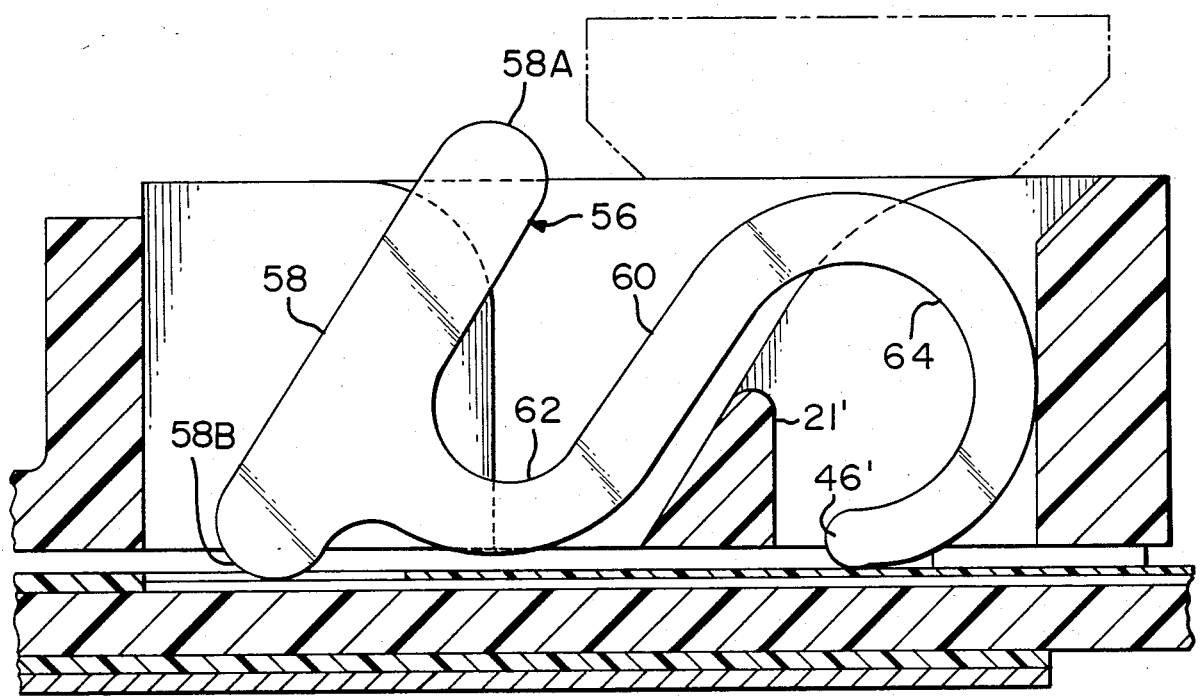
FIG. 4 is a cross-sectional view similar to that of FIG. 2 showing an alternate embodiment of the present invention.

Referring now to FIG. 4, there is shown a view similar to that of FIG. 2 with an alternate contact embodiment. It is to be remembered that components similar in structural operation to previously described components will be identified by the previously assigned numeral with the addition of the prime ('). Here an alternate embodiment contact is shown generally at 56 and which resembles an S which has been placed on its side and having a beam portion superimposed on one of the outermost curves. The alternate contact 56 has a primary beam 58 having an upper contact area 58a and a lower contact area 58b. A semi-circular bend 62 joins the primary beam 58 with a secondary beam 60. This secondary beam 60 then forms into a circular bend 64 with an end point 46' at the end of the circular beam 64.

Figure 5:
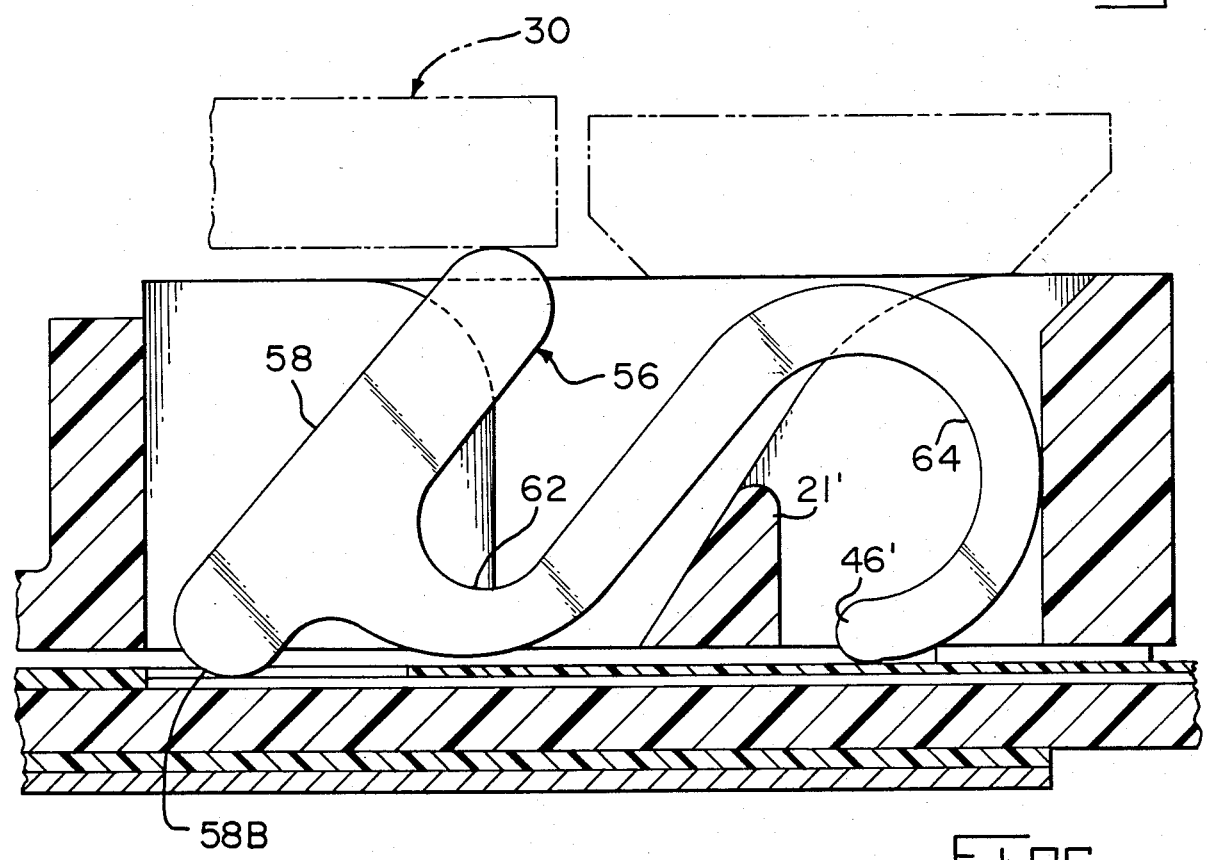
FIG. 5 is a cross-sectional view similar to that of FIG. 4 with an alternate embodiment of the present invention with an integrated circuit package installed.

Referring now to FIG. 5 there is a view similar to that of FIG. 4 with the addition of the chip carrier 30. Here in a fashion similar to that of FIG. 3 it can be seen how the use of the chip carrier 30 causes the primary beam 58 to move thereby causing the upper and lower contact areas 58a, 58b to electrically engage adjacent contact surfaces of the conductive strip 12 and the contact areas (not shown) of the chip carrier 30 in a wiping fashion. The circular bend 64 as well as the semi-circular bend 62 are used to provide proper and resilient contact forces. In FIGS. 4 and 5 an exterior wall contact barrier brace 21' is used to maintain the contact 56 in the chip carrier housing 14.

It is to be understood that many variations of the present invention may be utilized without departing from the spirit and scope of the present invention. For example, circuit boards may include any board, card, or substrate in which electrical conductors are secured. Additionally, different arrangements for maintaining the contacts in the chip carrier housing may be utilized while differing shapes of the chip carrier housing such as, for example, rectangular may be used. Further, different contact configurations utilizing similar beam and bend configurations may be used. Also the barriers between the contacts may extend completely between the interior and exterior portions of the chip carrier housing.

Therefore, in addition to the above enumerated advantages, the disclosed invention produces a low profile chip carrier housing contact which is relatively easy to manufacture, usable with a large variety of chip carrier housing configurations and which is inexpensive to manufacture. Further, contact length is kept to an absolute minimum thereby minimizing inductive, capacitive or propagation delay effects which may be of concern.

I claim:

1. A device for connecting a leadless integrated circuit chip carrier or package to a circuit board, comprising:

a circuit board having electrical conductors contained thereon;

chip carrier housing means disposed on said circuit board for receivably receiving a leadless integrated circuit chip carrier, said carrier housing means having on each side thereof a plurality of slots for receivably receiving contact means;

contact means disposed in said slots for providing electrical communication between a leadless integrated circuit chip carrier and said electrical conductors contained on said circuit board, said contacts having a first portion resembling an S which has been placed on its side having a second portion resembling a superimposed beam portion on one of the outermost curves, said beam portion having a contact area at each of its ends, with said beam ends being in engagement with opposed, inwardly facing, substantially planar surfaces of said circuit chip carrier and said circuit board, thereby providing electrical communication between a leadless integrated circuit chip carrier and said electrical conductors contained on said circuit board;

first bracket means disposed on said carrier housing means for retaining said contact means in said carrier means;

a leadless integrated circuit chip carrier disposed on said carrier housing means; and second bracket means disposed on the top of said leadless integrated circuit chip carrier for maintaining said leadless integrated circuit chip carrier in electrical communication with said contact means.

2. A device according to claim 1 wherein said chip carrier housing means is generally rectangular.

3. A device according to claim 1 wherein said contact means have a form obtained by having been cut from and lifted out from a flat sheet of metal.

4. A device according to claim 3 wherein said metal beryllium copper.

5. A device according to claim 1 wherein said contact means is comprised of an electrically insulative material and has an electrically conductive material disposed thereon.

6. A device according to claim 5 wherein said electrically conductive material is glass.

7. A device according to claim 5 wherein said electrically insulative material is comprised of plastic.

8. A device according to claim 5 wherein said electrically conductive material is copper.

9. A device according to claim 1 wherein said carrier means and said first and said second bracket means are comprised of an electrically insulative material.

10. A device according to claim 1 wherein said chip carrier means, said first bracket means and said second bracket means are comprised of plastic.

11. A device according to claim 1 wherein said circuit board is a printed circuit board.

12. A device according to claim 5 wherein said chip carrier means, said first bracket means and said second bracket means are comprised of plastic.

13. A device for connecting a leadless integrated circuit chip carrier or package to a circuit board, comprising:

a circuit board having electrical conductors contained thereon;

chip carrier housing means disposed on said circuit board for receivably receiving a leadless integrated circuit chip carrier, said carrier housing means having on each side thereof a plurality of slots for receivably receiving contact means;

contact means disposed in said slots for providing electrical communication between a leadless integrated circuit chip carrier and said electrical conductors contained on said circuit board, said contacts having a first portion resembling a U having a first contact area at one end thereof and a second contact area at the lowermost portion of the curve, which lowermost portion also forms a free end of the U, thereby defining beam ends with said beam ends being in engagement with opposed, inwardly facing, substantially planar surfaces of said circuit chip carrier and said circuit board, said contact further having a second portion resembling a S placed on its side having one end doubled back and attached at the remaining end of said U and said S portion having an elongated remaining end, said contact providing electrical communication between said first and second contact areas and thereby between said leadless integrated circuit chip carrier and said electrical conductors contained on said circuit board;

first bracket means disposed on said carrier means for retaining said contact means in said carrier means;

a leadless integrated circuit chip carrier disposed on said carrier housing means; and second bracket means disposed on the top of said leadless integrated circuit chip carrier for maintaining said leadless integrated circuit chip carrier in electrical communication with said contact means.

14. A device according to claim 13 wherein said chip carrier housing means is generally rectangular.

15. A device according to claim 13 wherein said contact means have a form obtained by having been cut from and lifted out from a flat sheet of metal.

16. A device according to claim 13 wherein said contact means is comprised of an electrically insulative material and has an electrically conductive material disposed thereon.

17. A device according to claim 13 wherein said carrier means and said first and second bracket means are comprised of an electrically insulative material.

18. A device according to claim 13 wherein said chip carrier means, said first bracket means and said second bracket means are comprised of plastic.

19. A device according to claim 13 wherein said circuit board is a printed circuit board.

* * * * *